(12) United States Patent
Snowdon

(10) Patent No.: US 8,542,055 B2
(45) Date of Patent: Sep. 24, 2013

(54) MULTI-LEVEL CONTROL FOR PASS TRANSISTOR GATE VOLTAGE

(75) Inventor: Kenneth P. Snowdon, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 5 days.

(21) Appl. No.: 12/977,535

(22) Filed: Dec. 23, 2010

(65) Prior Publication Data

US 2012/0161860 A1    Jun. 28, 2012

(51) Int. Cl.
*H03K 17/00*    (2006.01)

(52) U.S. Cl.
USPC .......................................... 327/403; 327/404

(58) Field of Classification Search
USPC .......................................... 327/403, 404–406
See application file for complete search history.

(56) References Cited

U.S. PATENT DOCUMENTS

2009/0237142 A1* 9/2009 Matsuda et al. ............. 327/512
2010/0156521 A1  6/2010 Stultz et al.

FOREIGN PATENT DOCUMENTS

KR    1020120072355    7/2012

OTHER PUBLICATIONS

"U.S. Appl. No. 13/244,936, Notice of Allowance mailed Aug. 9, 2012", 7 pgs.
"Chinese Application Serial No. 201120579457.4, Office Action mailed Jun. 12, 2012", 3 pg.
"Chinese Application Serial No. 201120579457.4, Response filed Aug. 27, 2012 to Notification to make Rectification mailed Jun. 12, 2012", 21 pgs.

* cited by examiner

*Primary Examiner* — Lincoln Donovan
*Assistant Examiner* — Diana J Cheng
(74) *Attorney, Agent, or Firm* — Schwegman Lundberg & Woessner P.A.

(57) ABSTRACT

A circuit for selectively providing a signal from a source to a sink is provided. The circuit includes a field effect transistor having a conducting state and a non-conducting state, the field effect transistor having a gate, a source, and a drain. The circuit also includes a first comparator configured to provide a first output based on a difference between a source voltage at the source of the field effect transistor and a first reference voltage. Finally, the circuit includes a switching amplifier configured to apply a first gate voltage to the gate of the field effect transistor as a function of the first output of the first comparator.

16 Claims, 4 Drawing Sheets

MULTI-LEVEL CONTROL FOR PASS TRANSISTOR GATE VOLTAGE

BACKGROUND

A field effect transistor (FET) can be used as an efficient pass through switching device that can selectively couple a signal from a signal source to a sink for that signal. Typically, pass through FETs are selected to have a low ON resistance (Ron) and a high OFF resistance (Roff). The low Ron enables a signal to pass through the FET with little loss or other affects caused by the FET.

For a FET, Ron is a function of the gate to source voltage, Vgs. As Vgs increases, the channel size for a FET also increases which reduces Ron for the FET. Accordingly, Ron has an inverse relationship to Vgs. Of course, to operate effectively as a pass through FET, Vgs can only be increased up to the gate oxide breakdown voltage or other maximum recommended operating voltage for the FET. This places an upper limit on how high Vgs can be set. Since a low Ron is typically desired, a FET used as a pass through switching device should have Vgs set to a point slightly below its gate oxide breakdown voltage.

Vgs, as the gate to source voltage, is dependent upon both the gate voltage and the source voltage; notably, the difference between the gate voltage and the source voltage. In a FET used as a pass through switching device, the gate voltage is controlled, while the source voltage is uncontrolled. The gate voltage is controlled to set the FET either ON (e.g., in a conducting state) or OFF (e.g., in a non-conducting state). The source voltage, however, is based on the voltage from the signal source; and is therefore uncontrolled. For example, when the FET is ON the source voltage is substantially equal to the voltage of a signal propagating into the source of the FET (referred to herein as the "input signal"). Accordingly, with the gate voltage set at a constant value while the FET is ON, Vgs will vary according to changes in the input signal.

This variation in Vgs causes a corresponding variation in Ron for the FET. In order to reduce the variation in Vgs, circuits have been designed such that the gate voltage of the FET tracks voltage variations in the input signal. These circuits use a non-switching amplifier (e.g., class A, B, AB amplifier) to generate the adjustable gate voltage for the FET. These non-switching amplifiers are typically configured such that the gate voltage continuously tracks the input signal (e.g., in an analog manner). Accordingly, these circuits typically account for all voltage swings of the input signal, including the voltage swings within a "constant" AC input signal (e.g., an AC signal having a constant common mode). That is, in these circuits a "constant" AC input signal will cause variation in the gate voltage such that Vgs remains substantially constant as the AC input signal swings from high to low.

OVERVIEW

The present inventor has recognized, among other things, that a switching amplifier (e.g., a class D amplifier, charge pump) can be used to generate a dynamically controlled gate voltage for a FET used as a pass through switching device. The switching amplifier can generate the gate voltage with a higher efficiency than a non-switching amplifier. In an example, the switching amplifier can control the gate voltage in order to maintain Ron for the FET within a desired range. To maintain Ron within a desired range, the gate voltage for the FET can be adjusted between two or more discrete levels. For example, when the FET is ON, the gate voltage can be dynamically adjusted between two or more discrete levels based on a common mode voltage of an input signal for the FET. When the common mode voltage increases (e.g., above a threshold), the gate voltage for the FET can be set to a higher of the discrete levels. Conversely, when the common mode voltage of the input signal decreases, the gate voltage for the FET can be set to a lower of the discrete levels.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
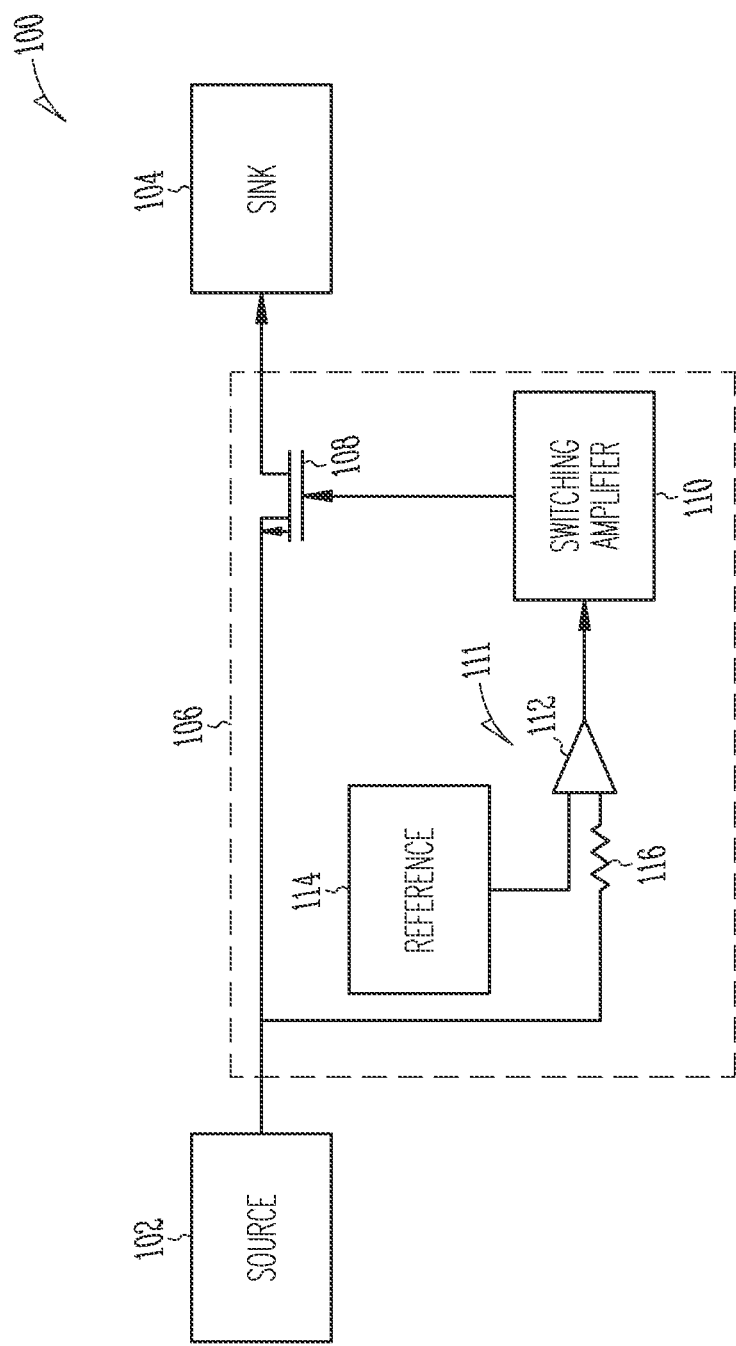
FIG. 1 illustrates generally an example system for multi-level control of a pass transistor gate voltage.

FIG. 1 illustrates an example of a system 100 for selectively coupling a signal from a signal source 102 to a sink 104. A switching device 106 is used to control whether the signal is coupled from the signal source 102 to the sink 104. The switching device can include a FET 108 configured as a pass through switching device. In an example, the FET 108 can include a source coupled to the signal source 102 and configured to receive an input signal from the signal source 102. A drain of the FET 108 can be coupled to the sink 104. A voltage present at the gate of the FET 108 can be used to control whether the FET 108 is ON such that an input signal from the signal source 102 is coupled to the sink 104 or OFF such that an input signal is not coupled to the sink 104. In an example, the FET 108 is an enhancement mode device. Accordingly, when 0 v (e.g., ground) is applied to the gate the FET 108 is OFF, and a positive voltage is applied to set the FET 108 ON. To set the FET 108 ON, the gate voltage should be large enough to provide a Vgs voltage that places the FET 108 in a conducting state.

The gate voltage of the FET 108 can be generated by a switching amplifier 110. Since in this example, the gate voltage is set at ground to set the FET 108 OFF, the switching amplifier 110 is not needed to generate a voltage to set the FET 108 OFF. The switching amplifier 110, however, can be configured to generate the positive gate voltage to set the FET 108 ON. In an example, the switching amplifier 110 can be configured to generate two or more discrete gate voltage levels to set the FET 108 ON. These discrete gate voltage levels can be used to adjust the gate voltage based on the voltage level of the input signal of the FET 108. In an example, the discrete gate voltage levels can be used to maintain the Vgs for the FET 108 within a desired range as the voltage level of the input signal changes. Vgs can be maintained within the desired range based on a desired range of Ron or ON capacitance (Con) for the FET 108. In an example, Vgs can be maintained within a desired range to maintain Ron within a range of minimum resistance for the FET 108.

In an example, an optimal Vgs can be determined based on a desired range of Vgs for the FET 108. For example, if the typical voltage range for the input signal is known, a desired Vgs can be determined such that the typical voltage range for the input signal results in a Vgs range that achieves a desired Ron range (e.g., a low Ron). In an example, the input signal is an AC signal that has a 1 volt voltage swing (e.g., swings from −0.5 volts to 0.5 volts). A desired Vgs is selected such that the 1 volt swing of the input signal stays within a low Ron range. For example, if the gate oxide breakdown voltage for the FET 108 is 5.5 volts, a desired Vgs to achieve a low Ron resistance for a one volt swing can be 4.3 volts. Accordingly, a gate voltage for the FET 108 can be set such that the common mode voltage for the input signal results in a Vgs of 4.3 volts. Thus, for an input signal with a common mode of 0 volts, the gate voltage can be set to 4.3 volts. Setting the gate voltage at 4.3 volts would result in a Vgs swing from 3.8 to 4.8 volts. This gate voltage setting could therefore maintain the Vgs voltage safely below the gate oxide breakdown voltage while also maintaining Ron within a desired (e.g., low) range. It should be understood that the voltage values provided herein are merely examples, and other voltages can be used.

In order to achieve a desired Vgs when the common mode voltage of the input signal is non-zero, the gate voltage can be set accordingly. For example, if the input signal has a common mode voltage of 2.5 volts and a 1 volt swing, the gate voltage can be set to 7.8 volts to achieve a Vgs of 4.3 volts at the common mode voltage.

In an example, the input signal can have different states and each state can have a different common mode voltage. For example, in a first state the input signal can include a signal, as mentioned above, having a common mode voltage of 2.5 volts and a voltage swing of 1 volt. In a second state the input signal can include a DC signal of 0 volts (e.g., when no signal is supplied by the signal source 102). Since the voltage of the input signal is significantly different from the first state to the second state, Vgs would drastically change from the first state to the second state if the gate voltage were held stable. Moreover, if, using the example presented above, the gate voltage is set to 7.8 volts and the gate oxide breakdown voltage is 5.5 volts when the input signal is in the second state, Vgs for the FET 108 would exceed the gate oxide breakdown voltage.

Accordingly, in an example, the gate voltage can be adjusted between multiple (e.g., N) discrete voltage levels based on the state of the input signal in order to achieve a desired Vgs for different states of the input signal. Thus, using the example above, when the input signal is in the second state (0 volts DC) the gate voltage can be set to 4.3 volts to achieve the desired Vgs of 4.3 volts. In an example, more than two discrete voltage levels can be used to maintain the Vgs of the FET 108 within a desired range. Accordingly, the system 100 could adjust for any number of different input signal states.

In an example, logic elements 111 can use the common mode voltage of the input signal can be used to determine which discrete voltage level to apply to the gate of the FET 108. For example, a comparator 112 can compare the common mode voltage of the input signal to a reference voltage 114. Based on the comparison, the comparator 112 can output one of a first signal and a second signal to the switching amplifier 110. Based on whether the first signal or second signal is received, the gate voltage generated by the switching amplifier 110 can be adjusted. Using the example described above, the reference voltage can be set to 4.0 volts. When the common mode voltage of the input signal is above 4.0 volts, the switching amplifier 110 can be set to generate 7.8 volts for the gate voltage. When the common mode voltage of the input signal is below 4.0 volts, the switching amplifier 110 can be set to generate 4.3 volts for the gate voltage. Accordingly, the switching amplifier 110 can be configured to generate two discrete gate voltage levels based on the common mode voltage of the input signal.

In these examples, since the switching amplifier 110 is configured to generate discrete voltage levels, the switching amplifier 110 can be configured to function as a DC-to-DC converter that generates multiple discrete DC voltages for applying to the gate of the FET 108. As such, in some examples, the switching amplifier 110 can be implemented with a charge pump as mentioned below with respect to FIG. 3.

In an example, the switching amplifier 110 can be configured to generate more than two discrete gate voltage levels. This can be accomplished in a manner based on that described above. In order to control the switching amplifier 110 with more than two discrete gate voltage levels, however, more than one voltage threshold can be used. The multiple threshold levels can be accomplished in several ways. In one example, multiple comparators can be used and each comparator can compare the common mode voltage of the input signal to a different reference voltage. In another example, one or more comparators can have different reference voltages coupled thereto at different times. In an example, a high value resistor 116 can be used to remove the capacitance of the comparator 112 from the input signal.

Figure 2:
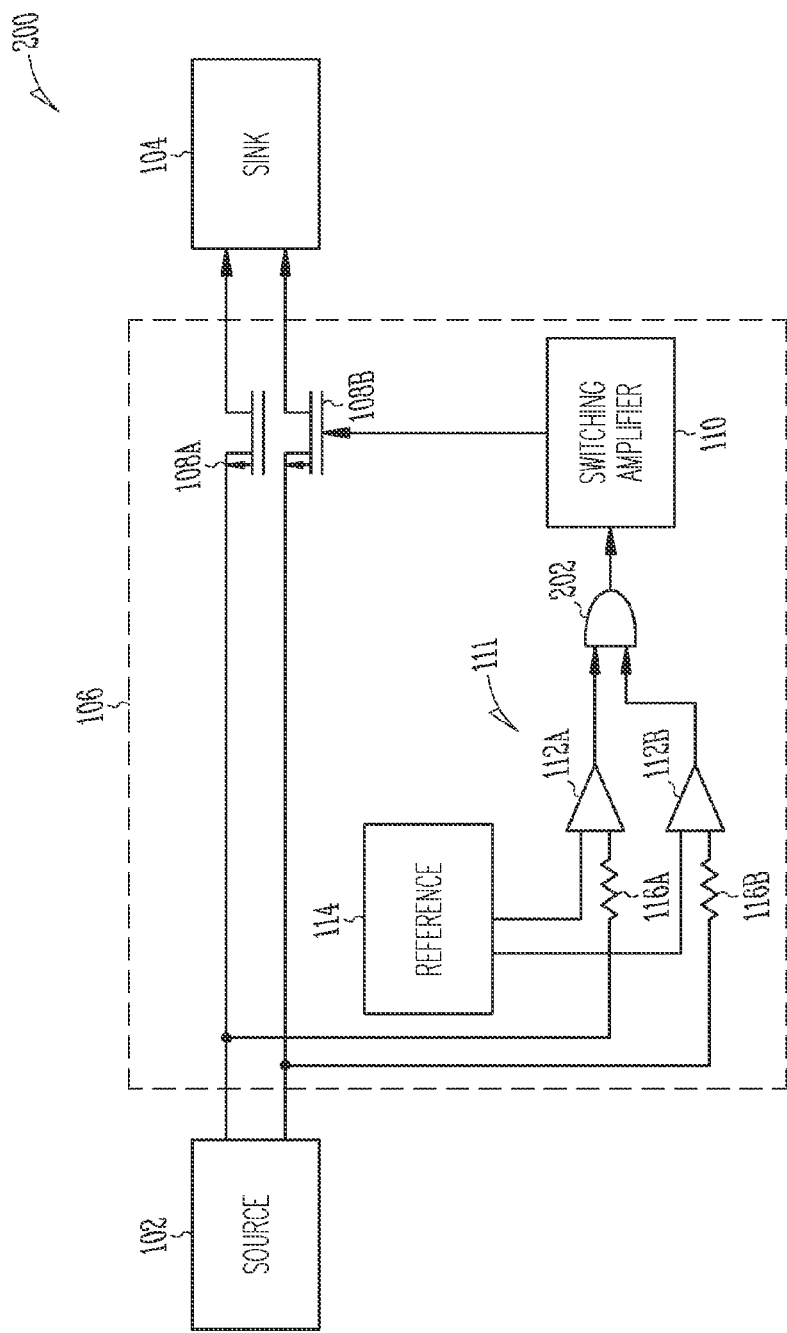
FIG. 2 illustrates generally another example system for multi-level control of a pass transistor gate voltage.

FIG. 2 illustrates an example system 200 having multiple FETs 108A, 108B for switching multiple input signals between the signal source 102 and the sink 104. In this example, the switching amplifier 110 provides the same gate voltage to both FETs 108A, 108B. In this example, the system 200 is configured to ensure that the Vgs for each FET 108A, 108B is adjusted based on the common mode voltage of the input signals while ensuring that neither FET 108A, 108B has their gate oxide breakdown voltage exceeded. Accordingly, in this example, two comparators 112A, 112B can be used to compare each input signal to the reference voltage 114. The output from the comparators 112A, 112B are logical OR'd 202 such that when the common mode voltage of either of the input signals drops below the reference voltage, the switching amplifier 110 is set to generate a lower (e.g., 4.3 volt) gate voltage for the FETs 108A, 108B. In other examples, system 200 can be configured to operate in a different manner, for example, system 200 can be configured to maintain a higher gate voltage (e.g., 7.8 volts) when the common mode voltage of one of the input signals is above the reference voltage and the other is below the reference voltage, and to set the gate voltage lower when the common mode voltage of both of the input signals is below the reference voltage. In other examples, other criteria can be used to determine the setting of the gate voltage level, including multiple different reference voltages as mentioned above. Furthermore, in some examples, system 200 can be extended to include more than two signal lines and more than two FETs 108. In some examples, each of the FETs 108 can have similar characteristics such that they can be switched using similar thresholds. Similar to system 100, high value resistors 114A, 114B can be used to remove the capacitance of the comparators 112A, 112B from the input signal.

Figure 3:
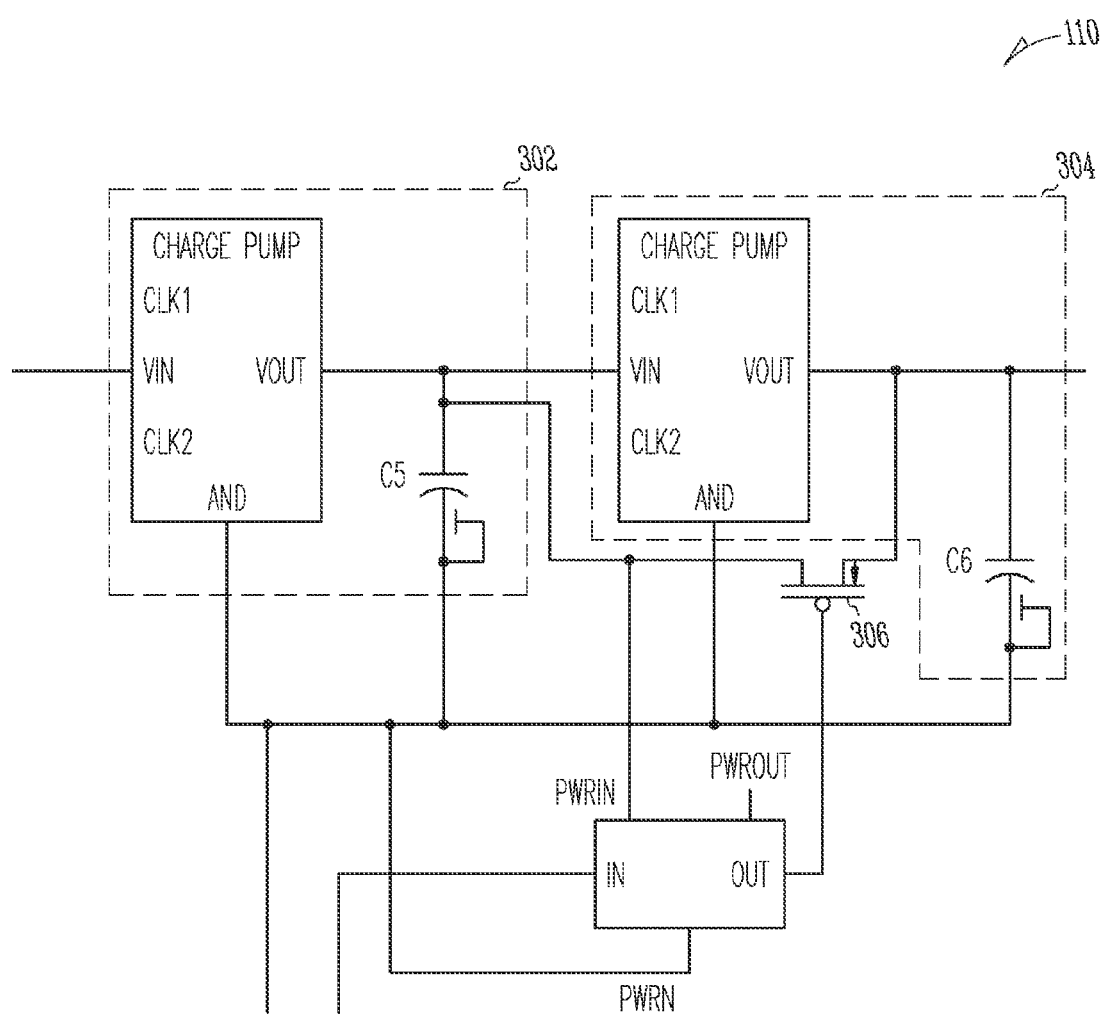
FIG. 3 illustrates generally an example of a switching amplifier for use in either of the systems of FIGS. 1 and 2.

FIG. 3 illustrates an example switching amplifier 110 for either the system 100 or 200 of FIGS. 1 and 2. In this example, the switching amplifier 110 includes a two stage charge pump configured to provide two discrete gate voltage levels to the FET 108. The first stage, shown generally at 302, can generate the lower of the two discrete gate voltage levels. Using the example described above, the first stage 302 can be configured to generate 4.3 volts for the gate voltage level. The second stage, shown generally at 304, can generate the higher of the discrete gate voltage levels. Again using the example described above, the second stage 304 can be configured to generate 7.8 volts. In this example, the second stage 304 can be configured to receive the lower voltage (4.3 volts) from the first stage 302 and boost the lower voltage up to the higher voltage (7.8 volts). Accordingly, both stages 302, 304 can be used to generate the higher voltage while only the first stage 302 is used to generate the lower voltage. A switch 306 can be configured to selectively bypass the second stage 304 and thus control whether the output voltage from the switching amplifier 110 is at the lower or higher voltage level. In an example, the switch 306 can be configured to receive a signal from the comparator 112 to set the switch 306 closed (bypass the second stage 304) or open (enable the second stage 304). As should be understood, the example switching amplifier 110 of FIG. 3 could be extended to generate more than two discrete voltage levels by, for example, using more than two stages. In yet other examples, a single stage charge pump could be used to generate two or more discrete voltage levels for the switching amplifier. Here, the duty cycle of a flying capacitor in the charge pump could be adjusted to generate different voltages with a single stage of the charge pump. In still other examples, other methods can be used to generate multiple discrete voltage levels with a charge pump. Moreover, in some examples, the multiple discrete voltage levels can be generated with another type of switching amplifier 110 (e.g., a class D amplifier).

Figure 4:
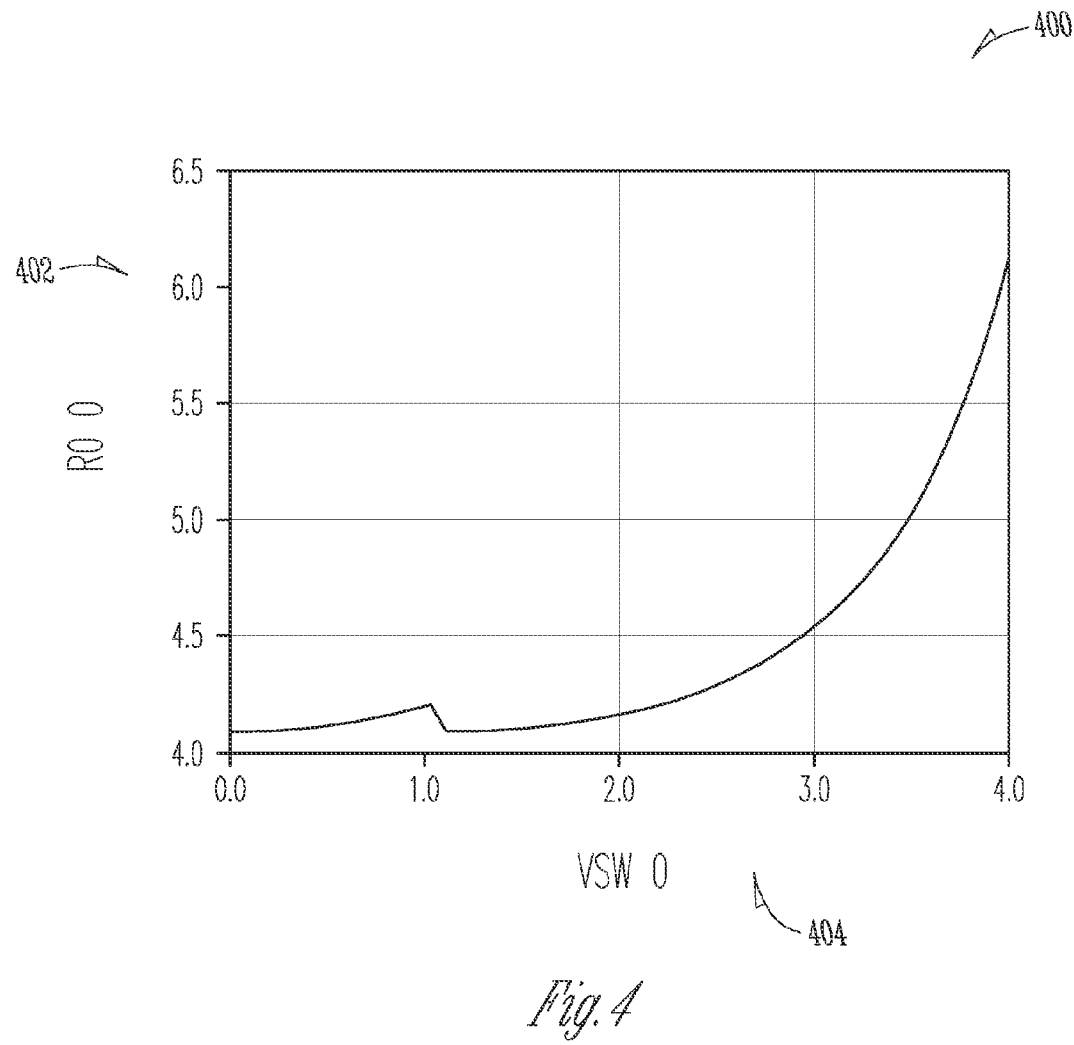
FIG. 4 illustrates generally an example graph of the ON resistance of a pass through FET from vs. the common mode voltage of an input signal.

FIG. 4 illustrates an example graph 400 illustrating the Ron 402 of the FET 108 vs. the common mode voltage 404 of the input signal to the FET 108 in system 100. Graph 400 illustrates the effect of applying two discrete gate voltages to the FET 108 based on the common mode voltage 404 of the input signal. Assuming a constant gage voltage, as the common mode voltage 404 increases, Vgs for the FET 108 decreases and Ron 402 for the FET 108 increases correspondingly. This is illustrated in the generally exponentially increasing curve in graph 400.

As shown in graph 400, Ron 402 increases gradually as the common mode voltage 404 increases from 0 to 1 volt while the gate voltage has a lower discrete voltage level (e.g., 4.3 volts) applied thereto. The increase in Ron corresponds with the decrease in Vgs from 4.3 volts to 3.3 volts.

In this example, however, when the common mode voltage reaches just over 1 volt, the reference voltage 114 is met and the gate voltage is increased to the higher discrete voltage level (e.g., 5.3 volts). This increase in the gate voltage level increases Vgs back up to 4.3 volts. Accordingly, Ron 402 is reduced back to around 4.1 Ohms. Then, as the common mode voltage 404 continues to increase from 1 volt to 4 volts, Vgs decreases from 4.3 volts down to 1.3 volts and Ron increases correspondingly.

As can be seen from graph 400, utilizing multiple discrete voltage levels can help maintain Ron 402 within a desired range (e.g., at a low value) across different common mode voltages. Thus, for example, Ron 402 can be maintained low within the common mode voltage range from 0 to 0.5 volts by setting the gate voltage at the lower of two discrete levels, and Ron 402 can also be maintained low within the common mode voltage range from 1.5-3.0 volts by setting the gate voltage to the higher of two discrete levels. In an example, the systems described herein can be particularly advantageous for switching in high speed communication links when the input signal has a common mode voltage that is above zero.

Additional Notes

In Example 1, a circuit providing a signal from a source to a sink is provided. The circuit includes a field effect transistor having a conducting state and a non-conducting state, the field effect transistor having a gate, a source, and a drain. A first comparator can be configured to provide a first output based on a difference between a source voltage at the source of the field effect transistor and a first reference voltage. A switching amplifier can be configured to apply a first gate voltage to the gate of the field effect transistor as a function of the first output of the first comparator.

In Example 2, the source voltage of Example 1 can optionally be equal to the first reference voltage, and the first gate voltage can optionally be set to the first reference voltage plus a desired Vgs voltage for the field effect transistor.

In Example 3, the first comparator in any one or more of Examples 1 and 2 can optionally be configured to compare a common mode voltage at the source with the first reference voltage.

In Example 4, the first output from the first comparator in any one or more of Examples 1-3 can optionally include a first signal when the source voltage is lower than the first reference voltage and a second signal with the source voltage is higher than the first reference voltage, wherein the first signal causes a second gate voltage to be applied to the gate and the second signal causes the first gate voltage to be applied to the gate, wherein the first gate voltage is higher than the second gate voltage.

In Example 5, the second gate voltage of Example 4 can optionally be a desired Vgs voltage for the field effect transistor that provides a low ON resistance, and wherein the first gate voltage can optionally be the Vgs voltage that provides a low ON resistance plus the first reference voltage.

In Example 6, the switching amplifier of Example 5 can optionally be configured to convert an input voltage to the second gate voltage when the comparator outputs the first signal and convert the input voltage to the first gate voltage when the comparator outputs the second signal.

In Example 7, the comparator in any one or more of Examples 4-6 can optionally be configured to be adjusted to compare a second reference voltage to the source voltage when the first comparator outputs the second signal, wherein the second reference voltage is higher than the first reference voltage, such that when the source voltage is higher than the second reference voltage, a third gate voltage is configured to be applied to the gate, the third gate voltage higher than the first gate voltage.

In Example 8, the switching amplifier of any one or more of Examples 4-7 can optionally include a first charge pump stage configured to provide a second gate voltage substantially equal to a desired Vgs voltage for the field effect transistor. The switching amplifier of any one or more of Examples 4-7 can also optionally include a second charge pump stage configured to provide the first gate voltage. The switching amplifier of any one or more of Examples 4-7 can also optionally include a switch configured to bypass the second charge pump stage when the comparator outputs the first signal, and couple the second gate voltage to the second charge pump stage and couple the first gate voltage from the second charge pump stage to the gate of the field effect transistor when the comparator outputs the second signal, such that the second charge pump stage is configured to convert the second gate voltage to the first gate voltage.

In Example 9, the circuit of any one or more of Examples 1-8 can optionally include a second comparator configured to provide a second output based on a difference between the source voltage and a third reference voltage, the third reference voltage higher than the first reference voltage, wherein when the source voltage is higher than the third reference voltage, a fourth gate voltage higher is applied to the gate.

In Example 10a method for providing a signal from a source to a sink with a field effect transistor having a gate, a source, and a drain is provided. The circuit can include comparing a source voltage at a source of the field effect transistor with a first reference voltage. The circuit can also include applying a first gate voltage to the gate of the field effect transistor when the source voltage is lower than the first reference voltage. The circuit can also include converting an input voltage at a first charge pump to a second gate voltage to apply to the gate of the field effect transistor when the source voltage is higher than the first reference signal, wherein the second gate voltage is higher than the first gate voltage.

In Example 11, the first gate voltage of Example 10 can optionally be equal to a desired Vgs voltage for the field effect transistor configured to provide a low ON resistance.

In Example 12, the second gate voltage of any one or more of Examples 10 and 11 can optionally be equal to the first reference voltage plus a desired Vgs voltage for the field effect transistor configured to provide a low ON resistance for the field effect transistor.

In Example 13, comparing in any one or more of Examples 10-12 can optionally include comparing a common mode voltage at the source with the first reference voltage.

In Example 14, applying in any one or more of Examples 10-13 can optionally include converting the input voltage at the first charge pump to the first gate voltage.

In Example 15, the method of any one or more of Examples 10-14 can optionally include comparing the source voltage to a second reference voltage when the source voltage is higher than the first reference voltage, wherein the second reference voltage is higher than the first reference voltage. The method of any one or more of Examples 10-14 can also optionally include applying a third gate voltage to the gate when the source voltage is higher than the second reference voltage, the third gate voltage higher than the first gate voltage.

In Example 16, the method of any one or more of Examples 10-15 can optionally include converting an input voltage at a second charge pump to the third gate voltage when the source voltage is higher the first gate voltage.

In Example 17, a circuit for providing a signal from a source to a sink is provided. The circuit can include a first field effect transistor having a first gate, a first source, and a first drain, the first field effect transistor configured to provide a first signal from the source to the sink. The circuit can also include a second field effect transistor having a second gate, a second source, and a second drain, the second field effect transistor configured to provide a second signal from the source to the sink. The circuit can also include a first comparator configured to provide a first output based on a difference between a source voltage at the first source of the first field effect transistor and a first reference voltage. The circuit can also include a second comparator configured to provide a second output based on a different between a source voltage at the second source of the second field effect transistor and the first reference voltage. The circuit can also include logic elements configured to receive the first output and the second output and provide a third output. The circuit can also include a switching amplifier configured to apply a first gate voltage to the first gate and the second gate as a function of the third output.

In Example 18, the first gate voltage of Example 17 can optionally be equal to the first reference voltage plus a desired Vgs voltage for the field effect transistor configured to provide a low ON resistance for the first field effect transistor, and wherein when both of the source voltage at the first source and the source voltage at the second source are higher than the first reference voltage, the switching amplifier is configured to apply the first gate voltage to the first gate and the second gate.

In Example 19, when either of the source voltage at the first source and the source voltage at the second source is lower than the first reference voltage, a second gate voltage of any one or more of Examples 17 and 18 can optionally be configured to be applied to the first gate and the second gate, the second gate voltage equal to a Vgs voltage for the field effect transistor configured to provide a low ON resistance for the first field effect transistor.

In Example 20, the first field effect transistor and the second field effect transistor of any one or more of Examples 17-19 can optionally have substantially similar characteristics.

In Example 21, the switching amplifier of any one or more of Examples 17-20 can optionally include a first charge pump stage configured to provide a second gate voltage equal to a desired Vgs voltage for the field effect transistor that provides a low ON resistance. The switching amplifier of any one or more of Examples 17-20 can also optionally include a second charge pump configured to provide the first gate voltage. The switching amplifier of any one or more of Examples 17-20 can also optionally include a switch configured to couple the second gate voltage to the first gate and the second gate when the logic outputs a signal indicating that either of the source voltage at the first source or the source voltage at the second source is lower than the first reference voltage, and couple the second gate voltage to the second charge pump stage and couple the first output voltage to the first gate and the second gate when the logic outputs a signal indicating that both of the source voltage at the first source and the source voltage at the second source are higher than the first reference voltage, such that the first charge pumps converts the output voltage from the second charge pump to the first gate voltage.

In Example 22, a system or apparatus can include, or can optionally be combined with any portion or combination of any portions of any one or more of Examples 1-21 to include, means for performing any one or more of the functions of Examples 1-21, or a machine-readable medium including instructions that, when performed by a machine, cause the machine to perform any one or more of the functions of Examples 1-21.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A circuit comprising:
    a field effect transistor having a conducting state and a non-conducting state, the field effect transistor having a gate, a source, and a drain;
    a first comparator configured to provide a first output based on a difference between a source voltage at the source of the field effect transistor and a first reference voltage, wherein the first output includes a first signal when the source voltage is higher than the first reference voltage and a second signal when the source voltage is lower than the first reference voltage;
    a switching amplifier configured to apply a first gate voltage to the gate of the field effect transistor in response to the first comparator providing the first signal and a second gate voltage to the gate of the field effect transistor in response to the first comparator providing the second signal, wherein both the first and second gate voltages are configured to place the field effect transistor in a conducting state;
    wherein the switching amplifier comprises:
        a first charge pump stage configured to provide the second gate voltage;
        a second charge pump stage configured to provide the first gate voltage;
        a switch configured to couple the second gate voltage to the second charge pump stage when the first comparator outputs the first signal; and
        wherein the second charge pump is configured to convert the second gate voltage into the first gate voltage when the first comparator outputs the first signal; and
    wherein the first gate voltage is higher than the second gate voltage.

2. The circuit of claim 1, wherein, when the source voltage is greater than the first reference voltage, the first gate voltage is greater than the first reference voltage plus a desired gate to source voltage (Vgs), but less than a gate oxide breakdown voltage of the field effect transistor with respect to the source voltage, to maintain a desired ON resistance of the field effect transistor in the conducting state.

3. The circuit of claim 1, wherein the source voltage at the source of the field effect transistor includes a common mode voltage at the source of the field effect transistor.

4. The circuit of claim 1, wherein, when the source voltage is less than the first reference voltage, the second gate voltage is greater than the source voltage of the field effect transistor plus a desired gate to source voltage (Vgs) to maintain a desired ON resistance of the field effect transistor in the conducting state.

5. The circuit of claim 1, including a second comparator configured to provide a second output based on a difference between the source voltage and a second reference voltage, wherein the second reference voltage is higher than the first reference voltage, wherein the second output includes a first signal when the source voltage is higher than the second reference and a second signal when the source voltage is lower than the second reference; and
    wherein the switching amplifier is configured to apply a third gate voltage to the gate of the field effect transistor in response to the second comparator providing the first signal, wherein the third gate voltage is higher than the first gate voltage.

6. A method for providing a signal from a source to a sink with a field effect transistor having a gate, a source, and a drain, the method comprising:
    comparing a source voltage at a source of the field effect transistor with a first reference voltage;
    applying a first gate voltage to the gate of the field effect transistor when the source voltage is higher than the first reference voltage and a second gate voltage to the gate of the field effect transistor when the source voltage is lower than the first reference voltage;
    converting an input voltage at a first charge pump to a first gate voltage to apply to the gate of the field effect transistor when the source voltage is higher than the first reference signal, wherein the first gate voltage is higher than the second gate voltage;
    wherein applying includes converting the input voltage at the first charge pump to the second gate voltage; and
    wherein both the first and second gate voltages are configured to place the field effect transistor in a conducting state.

7. The method of claim 6, wherein the first gate voltage is greater than the first reference voltage plus a desired gate to source voltage (Vgs), but less than a gate oxide breakdown voltage of the field effect transistor with respect to the source voltage, to maintain a desired ON resistance of the field effect transistor in the conducting state.

8. The method of claim 6, wherein the second gate voltage is greater than the source voltage of the field effect transistor plus a desired gate to source voltage (Vgs) to maintain a desired ON resistance of the field effect transistor in the conducting state.

9. The method of claim 6, wherein comparing includes comparing a common mode voltage at the source of the field effect transistor with the first reference voltage.

10. The method of claim 6, comprising:
comparing the source voltage to a second reference voltage when the source voltage is higher than the first reference voltage, wherein the second reference voltage is higher than the first reference voltage; and
applying a third gate voltage to the gate when the source voltage is higher than the second reference voltage, the third gate voltage higher than the first gate voltage.

11. The method of claim 10, comprising:
converting an input voltage at a second charge pump to the third gate voltage when the source voltage is higher the first gate voltage.

12. A circuit comprising:
a first field effect transistor having a first gate, a first source, and a first drain, the first field effect transistor configured to provide a first signal from the source to the sink;
a second field effect transistor having a second gate, a second source, and a second drain, the second field effect transistor configured to provide a second signal from the source to the sink;
a first comparator configured to provide a first output based on a difference between a source voltage at the first source of the first field effect transistor and a first reference voltage;
a second comparator configured to provide a second output based on a different between a source voltage at the second source of the second field effect transistor and the first reference voltage;
logic elements configured to receive the first output and the second output and provide a third output; and
a switching amplifier configured to apply a first gate voltage to the first gate and the second gate or a second gate voltage to the first gate and the second gate as a function of the third output, wherein the switching amplifier includes:
a first charge pump stage configured to provide the second gate voltage; and
a second charge pump configured to provide the first gate voltage; and
a switch configured to couple the second gate voltage to the first gate and the second gate when the third output indicates that either of the source voltage at the first source or the source voltage at the second source is lower than the first reference voltage.

13. The circuit of claim 12, wherein the first gate voltage is equal to the first reference voltage plus a desired Vgs voltage for the field effect transistor configured to provide a low ON resistance for the first field effect transistor, and wherein when both of the source voltage at the first source and the source voltage at the second source are higher than the first reference voltage, the switching amplifier is configured to apply the first gate voltage to the first gate and the second gate.

14. The circuit of claim 13, wherein when either of the source voltage at the first source and the source voltage at the second source is lower than the first reference voltage, a second gate voltage is configured to be applied to the first gate and the second gate, the second gate voltage equal to a Vgs voltage for the field effect transistor configured to provide a low ON resistance for the first field effect transistor.

15. The circuit of claim 12, wherein the first field effect transistor and the second field effect transistor have substantially similar characteristics.

16. The circuit of claim 12, wherein the first charge pump stage is configured to provide a second gate voltage equal to a desired Vgs voltage for the field effect transistor that provides a low ON resistance;
and
wherein the switch is configured to
couple the second gate voltage to the second charge pump stage and couple the first output voltage to the first gate and the second gate when the third output indicates that both of the source voltage at the first source and the source voltage at the second source are higher than the first reference voltage, such that the first charge pumps converts the output voltage from the second charge pump to the first gate voltage.

\* \* \* \* \*